United States Patent
Cheng

(10) Patent No.: US 9,209,823 B2
(45) Date of Patent: Dec. 8, 2015

(54) DECODER LEVEL SHIFTER DEVICE AND DIGITAL TO ANALOG CONVERTER USING THE SAME

(71) Applicant: FocalTech Systems Co., Ltd., Hsinchu (TW)

(72) Inventor: Yen-Cheng Cheng, Hsinchu (TW)

(73) Assignee: FOCALTECH SYSTEMS CO., LTD., Hsinchu (TW)

(*) Notice: Subject to any disclaimer, the term of this patent is extended or adjusted under 35 U.S.C. 154(b) by 0 days.

(21) Appl. No.: 14/683,190

(22) Filed: Apr. 10, 2015

(65) Prior Publication Data

US 2015/0295585 A1    Oct. 15, 2015

(30) Foreign Application Priority Data

Apr. 10, 2014  (TW) .............................. 103113239 A

(51) Int. Cl.
  *H03M 1/66* (2006.01)
  *H03M 1/00* (2006.01)
  *H03K 3/356* (2006.01)

(52) U.S. Cl.
  CPC .......... *H03M 1/002* (2013.01); *H03K 3/356069* (2013.01); *H03M 1/66* (2013.01)

(58) Field of Classification Search
  CPC ....... H03M 1/002; H03M 1/66; H03M 1/765; H03M 1/662; H03M 1/661; H03M 1/76; H03M 1/0617; H03M 1/682; H03M 1/685; H03M 1/70; H03K 3/356069; H03K 19/17796; H03K 3/356121; H03K 3/35613
  USPC ............... 341/144, 65, 145; 345/98, 204, 100
  See application file for complete search history.

(56) References Cited

U.S. PATENT DOCUMENTS

| | | | | |
|---|---|---|---|---|
| 5,696,507 A * | 12/1997 | Nam | ..................... | H03M 7/425 341/65 |
| 6,329,941 B1 * | 12/2001 | Farooqi | ................. | H03M 1/687 341/144 |
| 6,384,754 B1 * | 5/2002 | Park | ..................... | H03M 1/109 324/760.01 |
| 7,394,419 B2 * | 7/2008 | Hashido | ............... | G09G 3/3688 341/144 |
| 7,492,341 B2 * | 2/2009 | Tachibana | ............ | G09G 3/3677 345/204 |
| 7,768,316 B2 * | 8/2010 | Toriumi | ................... | G11C 8/10 326/105 |
| 2006/0208996 A1 * | 9/2006 | Tachibana | ................ | G09G 3/20 345/100 |
| 2011/0001692 A1 * | 1/2011 | Tu | ........................ | G09G 3/3688 345/98 |
| 2013/0135025 A1 * | 5/2013 | Ripley | ..................... | H03L 5/00 327/306 |

* cited by examiner

*Primary Examiner* — Jean B Jeanglaude
(74) *Attorney, Agent, or Firm* — Bacon & Thomas, PLLC

(57) ABSTRACT

A decoder level shifter device includes a first decoder level shifter and a second decoder level shifter. The first decoder level shifter has first to fourth input terminals, first and second output terminals, first and second enable terminals, first and second reset terminals. The first to fourth input terminals receive first to second input signals and their complementary signals, respectively. The second decoder level shifter has fifth to eighth input terminals, third to fourth output terminals, and third and fourth enable terminals. The fifth to eighth input terminals receive the first and second input signals and their complementary signals, respectively. The first, second, third, and fourth enable terminals are connected to the fourth, third, second, and first output terminals, respectively.

19 Claims, 9 Drawing Sheets

DECODER LEVEL SHIFTER DEVICE AND DIGITAL TO ANALOG CONVERTER USING THE SAME

BACKGROUND OF THE INVENTION

1. Field of the Invention

The present invention relates to the technical field of level shifters and digital to analog converters and, more particularly, to a decoder level shifter device and a digital to analog converter using the same.

2. Description of Related Art

A voltage level shifter is typically used in changing a low-voltage control signal into a high-voltage control signal. For example, for applying in an LCD device, it typically needs to change a low-voltage digital control signal into a high-voltage control signal in order to drive the TFTs, and thus the voltage level shifter has to be used for proceeding with the voltage level shift.

FIG. 1 is a schematic diagram of a typical decoder level shifter device 100. With the decoder level shifter device 100, when data A[1:0] is inputted, its high and low voltages are indicated by VCC and VSS. After passing through a decoder 110, the decoded signals S0-S3 are generated, and the high and low voltages for the decoded signals S0-S3 are still at VCC and VSS. Next, after passing through four level shifters (LSs) 120, four shifted and decoded signals S0H-S3H, which have high and low voltages VDDA and VSS, are correspondingly generated.

FIG. 2 is a partial circuit of the prior decoder level shifter device 100. From FIG. 2, it is known that the decoder needs at least four decoding circuits 210 to respectively decode the decoded signals S0-S3. One decoding circuit is comprised of at least four transistors, and one level shifter (LS) 120 is comprised of at least four transistors, while there are several transistors required for an inverter. Therefore, one prior decoder level shifter device 100 is comprised of at least 44 transistors, in which the four level shifters 120 have 16 transistors, the four decoding circuits 210 have 16 transistors, and four inverters have 12 transistors. Accordingly, with the decoder 110 and the level shifters 120, the prior art encounters the problem of increased layout area and power consumption. Therefore, it is desirable to provide an improved decoder level shifter device to mitigate and/or obviate the aforementioned problems.

SUMMARY OF THE INVENTION

The object of the present invention is to provide a decoder level shifter device and a digital to analog converter using the same, which can greatly decrease the number of transistors required and reduce the wafer area occupied by the circuits, so as to achieve the functions of lowering the cost and reducing the power consumption.

According to a feature of the present invention, there is provided a decoder level shifter device is provided, which includes a first decoder level shifter having first to fourth input terminals, a first output terminal, a second output terminal, a first enable terminal, a second enable terminal, a first reset terminal, and a second reset terminal, the first to fourth input terminals receiving a first signal, an inversion of first signal, a second signal, and an inversion of second signal, the first decoder level shifter including a latch, a first input block, a second input block, and first to fourth switches; a second decoder level shifter having fifth to eighth input terminals, a third output terminal, a fourth output terminal, a third enable terminal, and a fourth enable terminal, the fifth to eighth input terminals receiving the first signal, the inversion of first signal, the second signal, and the inversion of second signal, wherein the first enable terminal is connected to the fourth output terminal, the second enable terminal is connected to the third output terminal, the third enable terminal is connected to the second output terminal, and the fourth enable terminal is connected to the first output terminal.

According to another feature of the present invention, there is provided a digital to analog converter for converting a 2×n bit input data into an analog output signal, where n is a positive integer. The digital to analog converter includes: a latch device for receiving the 2×n-bit input data to generate a 2×n-bit latch data; n decoder level shifter devices connected to the latch device for respectively receiving a 2-bit latch data of the 2×n-bit latch data so as to generate a set of first to fourth control signals; and a voltage selection device having n levels of selector set, wherein a j-th set of the first to fourth control signals controls selectors of a j-th level of selector set in the n levels of selector set, where j is an index which is a positive integer.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
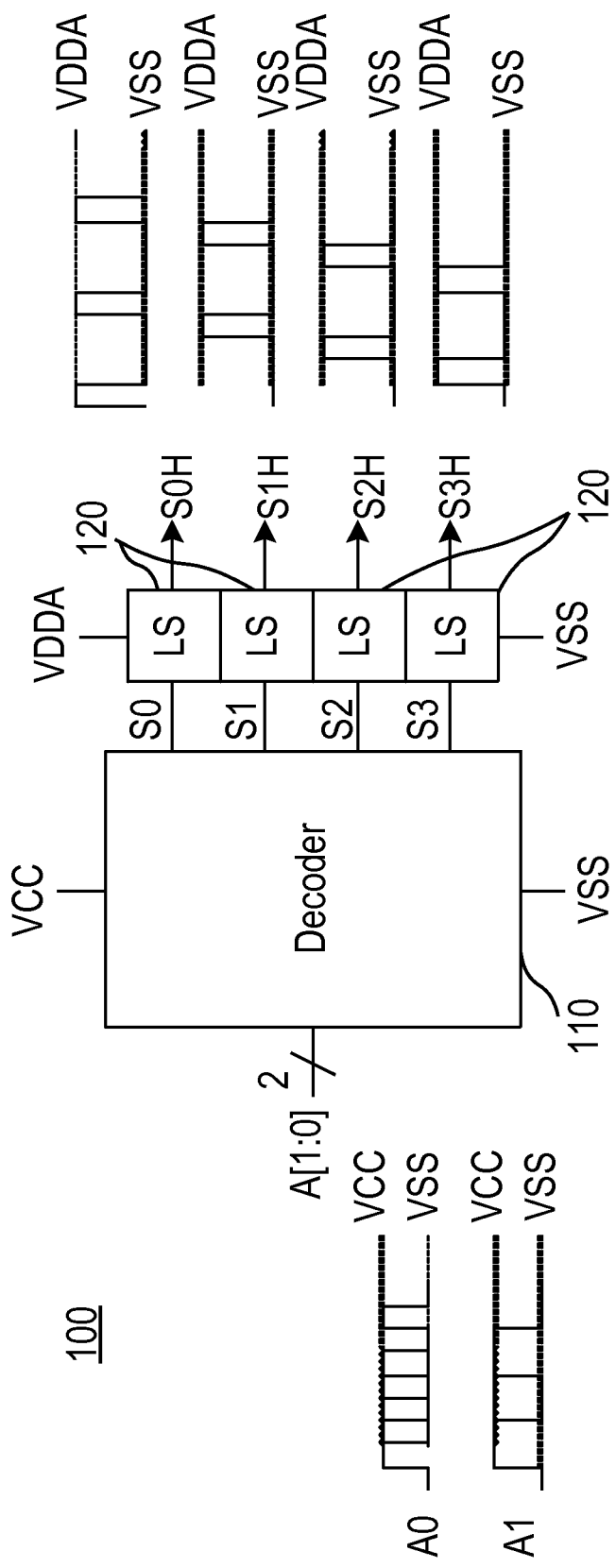
FIG. 1 is a schematic diagram of a typical decoder level shifter device.
Figure 2:
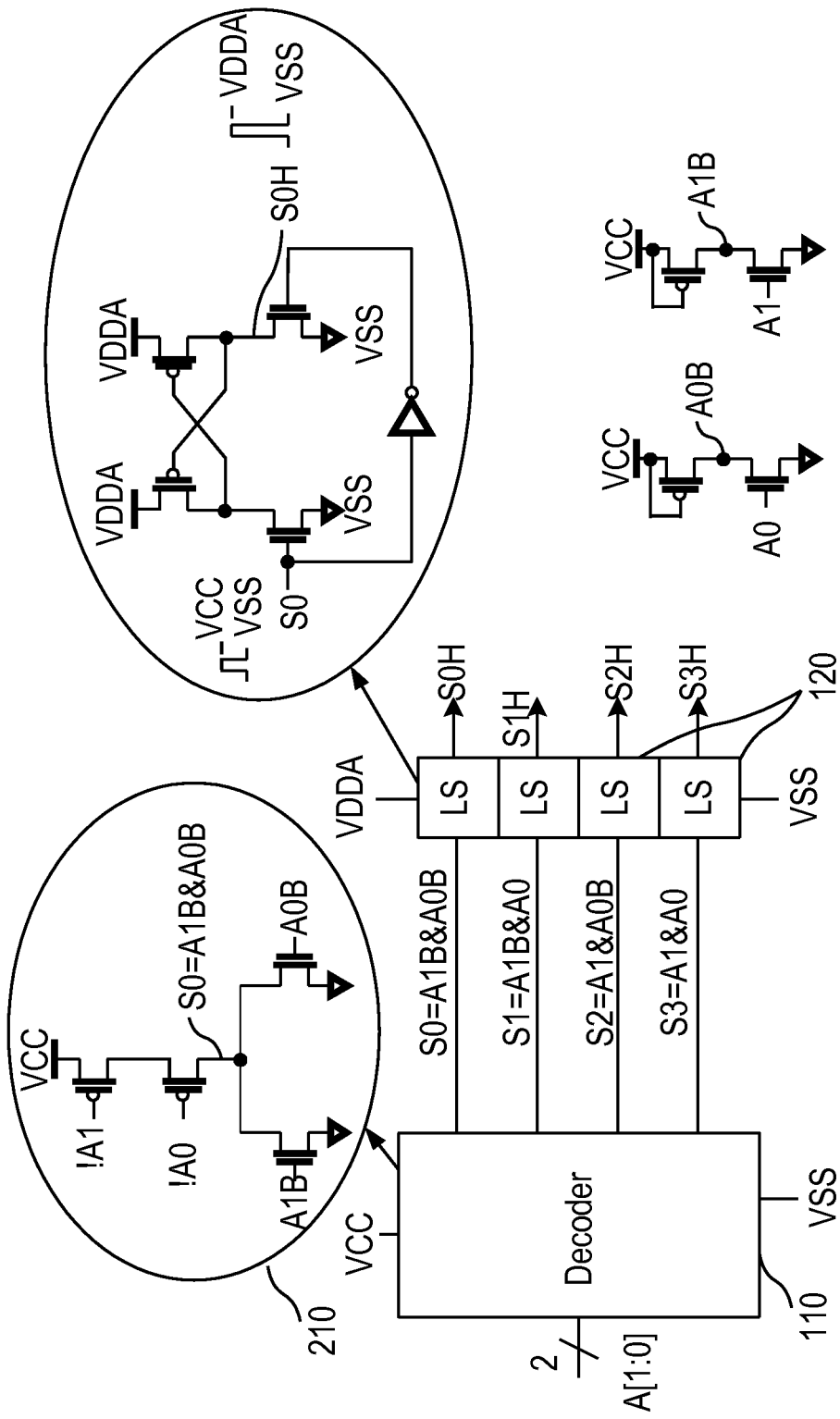
FIG. 2 is a partial circuit of the prior decoder level shifter device.
Figure 3:
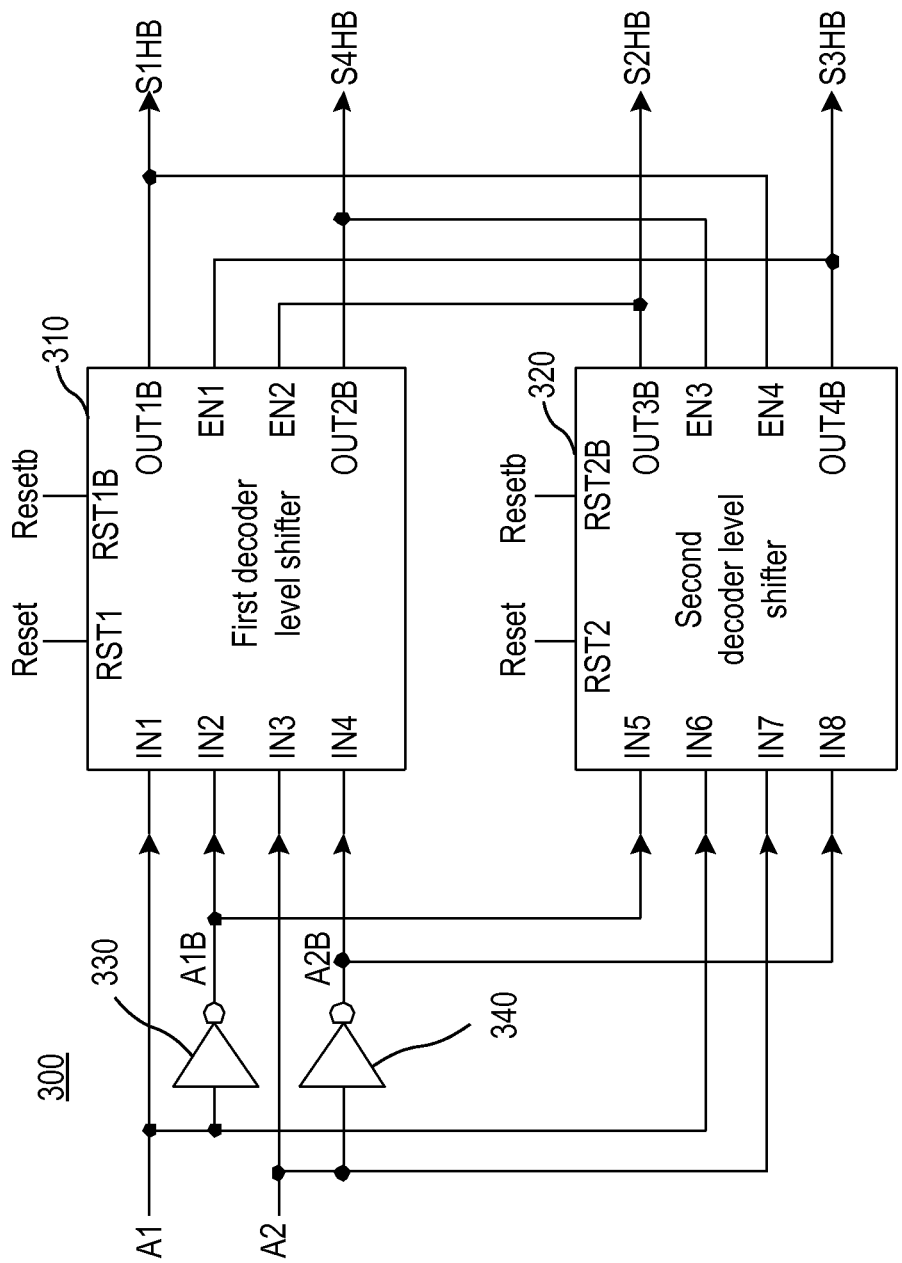
FIG. 3 is a system block diagram of a decoder level shifter device according to the invention.

FIG. 3 is a system block diagram of a decoder level shifter device 300 according to the invention. The device 300 includes a first decoder level shifter 310, a second decoder level shifter 320, a first inverter 330, and a second inverter 340. The first decoder level shifter 310 has first to fourth input terminals IN1, IN2, IN3, IN4, a first output terminal OUT1B, a second output terminal OUT2B, a first enable terminal EN1, a second enable terminal EN2, a first reset terminal Rst1, and a second reset terminal Rst1B. The first to fourth input terminals IN1, IN2, IN3, IN4 receive a first signal A1, a second signal A2, and their inverted signals A1B, A2B. The second decoder level shifter 320 has fifth to eighth input terminals IN5, IN6, IN7, IN8, a third output terminal OUT3B, a fourth output terminal OUT4B, a third enable terminal EN3, and a fourth enable terminal EN4. The fifth to eighth input terminals IN5, IN6, IN7, IN8 receive the first signal A1, the second signal A2, and their inverted signals A1B, A2B. The first enable terminal EN1 is connected to the fourth output terminal OUT4B. The second enable terminal EN2 is connected to the third output terminal OUT3B. The third enable terminal EN3 is connected to the second output terminal OUT2B. The fourth enable terminal EN4 is connected to the first output terminal OUT4B.

Figure 4:
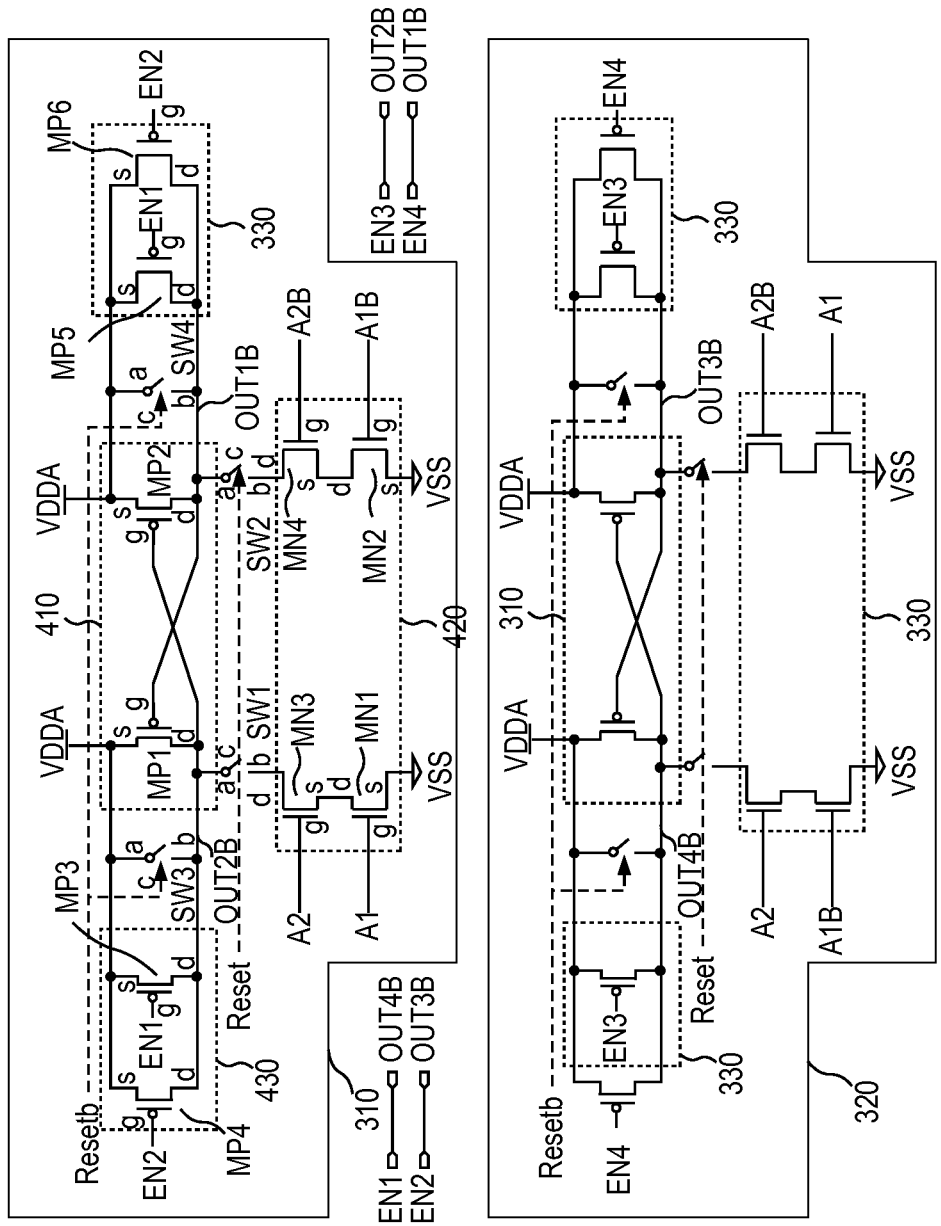
FIG. 4 is a circuit diagram of the decoder level shifter according to the invention.

The first decoder level shifter 310 and the second decoder level shifter 320 have the same circuit structure. FIG. 4 is a circuit diagram of the decoder level shifter according to the invention. As shown, the first decoder level shifter 310 includes a latch 410, a first input block 420, a second input block 430, and first to fourth switches SW1, SW2, SW3, SW4. The latch 410 includes a first PMOS transistor MP1 and a second PMOS transistor MP2. The first input block 420 includes first to fourth NMOS transistors MN1, MN2, MN3, MN4. The second input block 430 includes third to sixth PMOS transistors MP3, MP4, MP5, MP6.

The first PMOS transistor MP1 has a source (s) connected to a high voltage VDDA, a gate (g) connected to the first output terminal OUT1B, and a drain (d) connected to a gate (g) of the second PMOS transistor MP2. The second PMOS transistor MP2 has a source (s) connected to the high voltage VDDA and a drain (d) connected to the gate (g) of the first PMOS transistor MP1.

The first switch SW1 has a first terminal (a) connected to the drain (d) of the first PMOS transistor MP1, a second terminal (b) connected to a drain (d) of the third NMOS transistor MN3, and a control terminal (c) connected to a reset signal Reset. The second switch SW2 has a first terminal (a) connected to the drain (d) of the second PMOS transistor MP2, a second terminal (b) connected to a drain (d) of the fourth NMOS transistor MN4, and a control terminal (c) connected to the reset signal Reset.

The third NMOS transistor MN3 has a gate (g) connected to receive the second signal A2, and a source (s) connected to a drain (d) of the first NMOS transistor MN1. The first NMOS transistor MN1 has a gate (g) connected to receive the first signal A1, and a source (s) connected to a ground voltage VSS.

The fourth NMOS transistor MN4 has a gate (g) connected to receive the inversion of second signal A2B and has a source (s) connected to the drain (d) of the second NMOS transistor MN2. The second NMOS transistor MN2 has a gate (g) connected to receive the inversion of first signal A1B and a source (s) connected to the ground voltage VSS.

The third PMOS transistor MP3 has a source (s) connected to the high voltage VDDA, a gate (g) connected to the first enable terminal EN1, and a drain (d) connected to the drain (d) of the first PMOS transistor MP1. The fourth PMOS transistor MP4 has a source (s) connected to the high voltage VDDA, a gate (g) connected to the second enable terminal EN2, and a drain (d) connected to the drain (d) of the first PMOS transistor MP1.

The third switch SW3 has a first terminal (a) connected to the source (s) of the first PMOS transistor MP1, a second terminal (b) connected to the drain (d) of the first PMOS transistor MP1, and a control terminal (c) connected to an inversion of reset signal Resetb.

The fifth PMOS transistor MP5 has a source (s) connected to the high voltage VDDA, a gate (g) connected to the first enable terminal EN1, and a drain (d) connected to the drain (d) of the second PMOS transistor MP2. The sixth PMOS transistor MP6 has a source (s) connected to the high voltage VDDA, a gate (g) connected to the second enable terminal EN2, and a drain (d) connected to the drain (d) of the second PMOS transistor MP2.

The fourth switch SW4 has a first terminal (a) connected to the source (s) of the second PMOS transistor MP2, a second terminal (b) connected to the drain (d) of the second PMOS transistor MP2, and a control terminal (c) connected to receive the inversion of reset signal Resetb.

Since the first decoder level shifter 310 and the second decoder level shifter 320 have the same circuit structure, a detailed description for the circuit of the second decoder level shifter 320 is deemed unnecessary.

The first signal A1 and the second signal A2 are passed through the first inverter 330 and the second inverter 340 and inputted into the first to fourth input terminals IN1, IN2, IN3, IN4 of the first decoder level shifter 310 and the fifth to eighth input terminals IN5, IN6, IN7, IN8 of the second decoder level shifter 320 as cited above. The reset signal Reset and the inversion of reset signal Resetb control the first to fourth switches SW1-SW4 to be on/off.

Before performing a voltage level shift, it needs to turn the first and second switches SW1, SW2 off and the third and fourth switches SW3, SW4 on, such that the first output terminal OUT and the second output terminal OUTB are at the high voltage VDDA. The second decoder level shifter 320 is operated in the same manner, such that the third output terminal OUT3B and the fourth output terminal OUT4B are at VDDA.

When the first signal A1, the second signal A2, and their inverted signals A1B, A2B have a steady input voltage, the first switch SW1 and the second switch SW2 are turned on, and the third switch SW3 and the fourth switch SW4 are turned off. The first output terminal OUT1B and the second output terminal OUT2B are pulled from the high voltage VDDA to the ground voltage VSS because of the on path of the first and third NMOS transistors MN1, MN3 or the on path of the second and fourth NMOS transistors MN2, MN4.

The first enable terminal EN1 and the second enable terminal EN2 are controlled by the third output terminal OUT3B and the fourth output terminal OUT4B of the second decoder level shifter 320, respectively. When the second signal A2 and the first signal A1 are at a high voltage VCC, i.e., A[2:1]=11b, the second output terminal OUT2B of the first decoder level shifter 310 is at a low voltage level VSSA and the first output terminal OUT1B thereof is at the voltage level VDDA, and the third and fourth output terminals OUT3B, OUT4B of the second decoder level shifter 320 are pulled to the voltage VDDA because the third enable terminal EN3 and the fourth enable terminal EN4 are connected to the second output terminal OUT2B and the first output terminal OUT1B, respectively.

When the second signal A2 and the first signal A1 are the high voltage VCC or the low voltage VSS respectively, i.e., A[2:1]=00b, 01b, or 10b, the operation is the same as cited above, and thus a detailed description therefor is deemed unnecessary.

Figure 5:
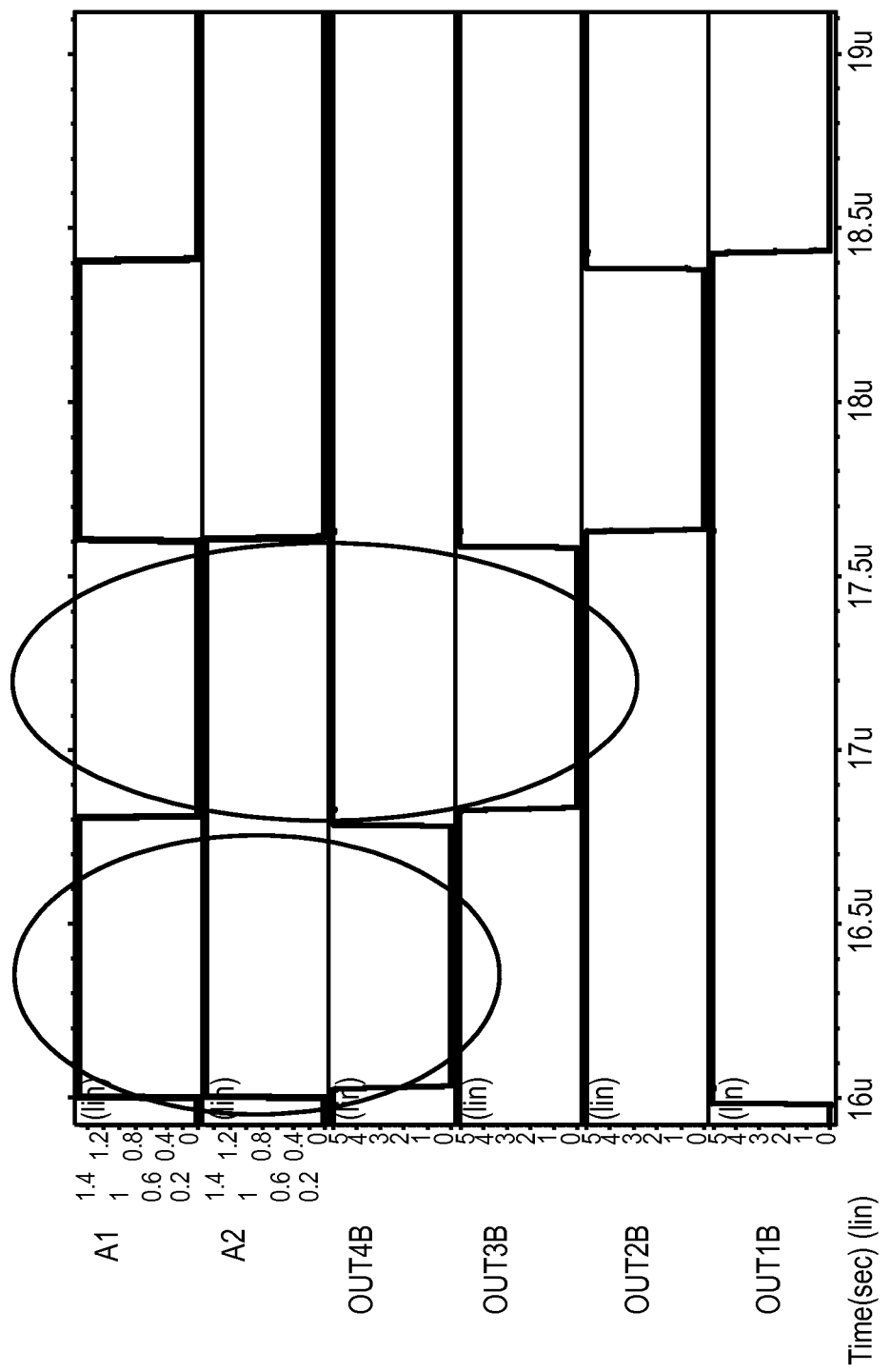
FIG. 5 schematically illustrates a simulation of a decoder level shifter device according to the invention.

FIG. 5 schematically illustrates a simulation of the decoder level shifter device 300 according to the invention. As shown in FIG. 5, when the second signal A2 and the first signal A1 are at the high voltage VCC=1.4V, the voltage of the fourth output terminal OUT4B is changed from the voltage VDDA (=5V) to the voltage VSS(=0V). When the second signal A2 is at the high voltage VCC=1.4V and the first voltage A1 is at the low voltage VSS=0V, the voltage of the third output terminal OUT3B is changed from the voltage VDDA=5V to the voltage VSS=0V while the voltage of the fourth output terminal OUT4B is changed from the voltage VSS=0V to the voltage VDDA=5V. Therefore, the invention can achieve the function of simultaneously decoding and level shifting.

Each of the first to fourth switches SW1, SW2, SW3, SW4 can be implemented by a simple MOS transistor. The device 300 requires only 32 transistors to complete the decoding and the level shifting functions. Each of The first decoder level shifter 310 and the second decoder level shifter 320 has 14 transistors (including the switches). Each of the first inverter 330 and the second inverter 340 has two transistors. Therefore, the invention can save 12 transistors in comparison with the prior art, so as to thus reduce the entire layout area and the power consumption, thereby surely achieving the cost-down effect.

Figure 6:
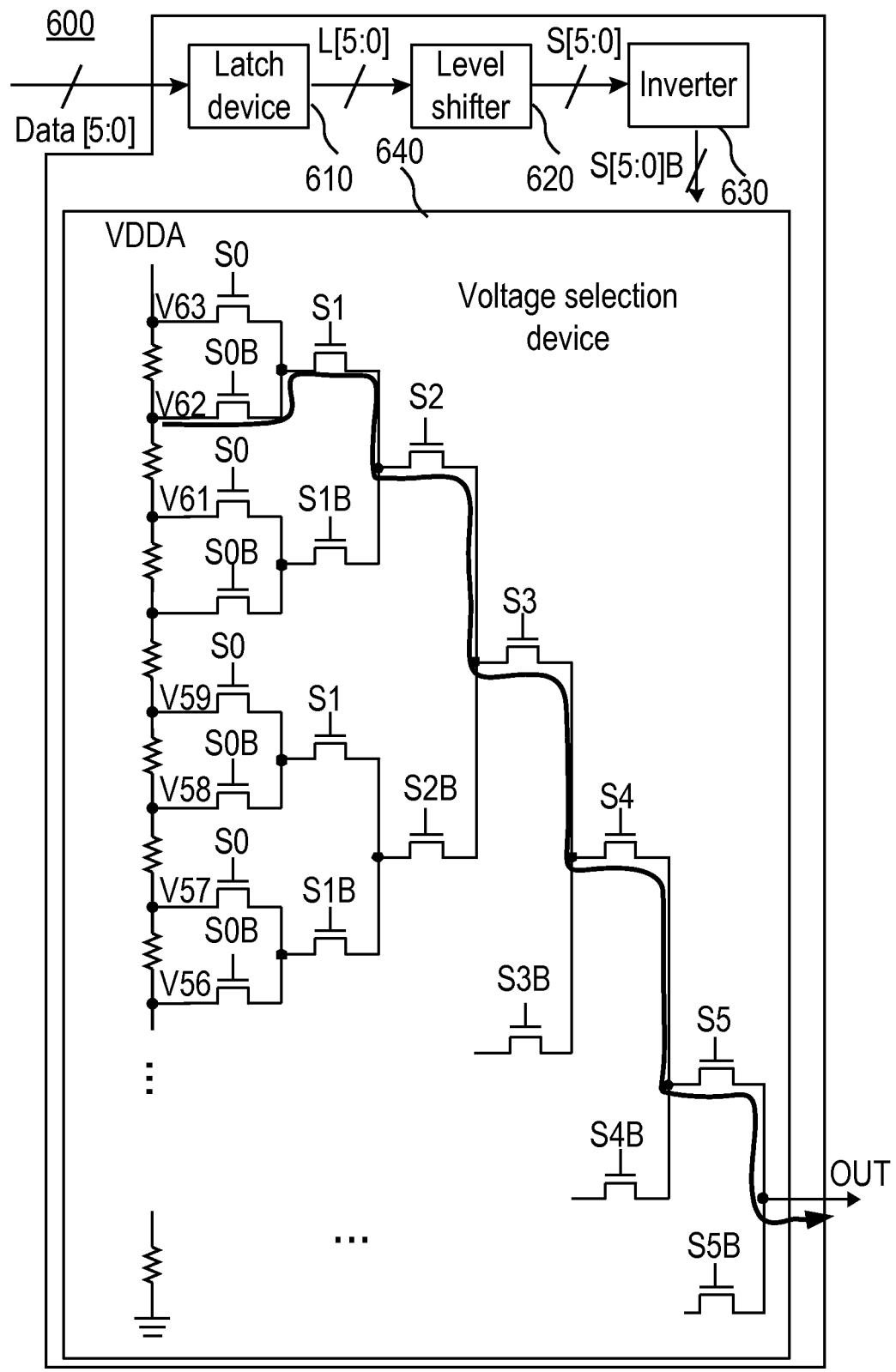
FIG. 6 is a circuit diagram of a typical 6-bit digital to analog converter in the prior art.

FIG. 6 is a circuit diagram of a typical 6-bit digital to analog converter 600 in the prior art. The 6-bit digital to analog converter 600 includes a latch device 610, a level shifter 620, an inverter 630, and a voltage selection device 640. An input data Data[5:0] is latched by the latch device 610 to generate a signal L[5:0], then passed through the level shifter 620 to generate a signal S[5:0], and finally inverted in phase by the inverter 630 so as to generate a signal S[5:0]B. Thus, a corresponding analog output OUT is generated from the input data Data[5:0]. For example, as shown in FIG. 6, when the input data Data[5:0] is 111110b(=62), the outputs S5, S4, S3, S2, S1, S0B are at a high voltage, the corresponding transistors are turned on, and the voltage V62 is outputted to the output terminal OUT. However, in the typical 6-bit digital to analog converter 600, the voltage selection device 640 has to use six levels of transistors, and requires 64, 32, 16, 8, 4, 2 transistors for the six levels, respectively; i.e., there are 126 transistors in total required for the voltage selection device 640. If a PMOS transistor and an NMOS transistor are used, there are 252 transistors required for the selection device 640, resulting in the increase of cost and power consumption due to too many transistors being used.

Figure 7:
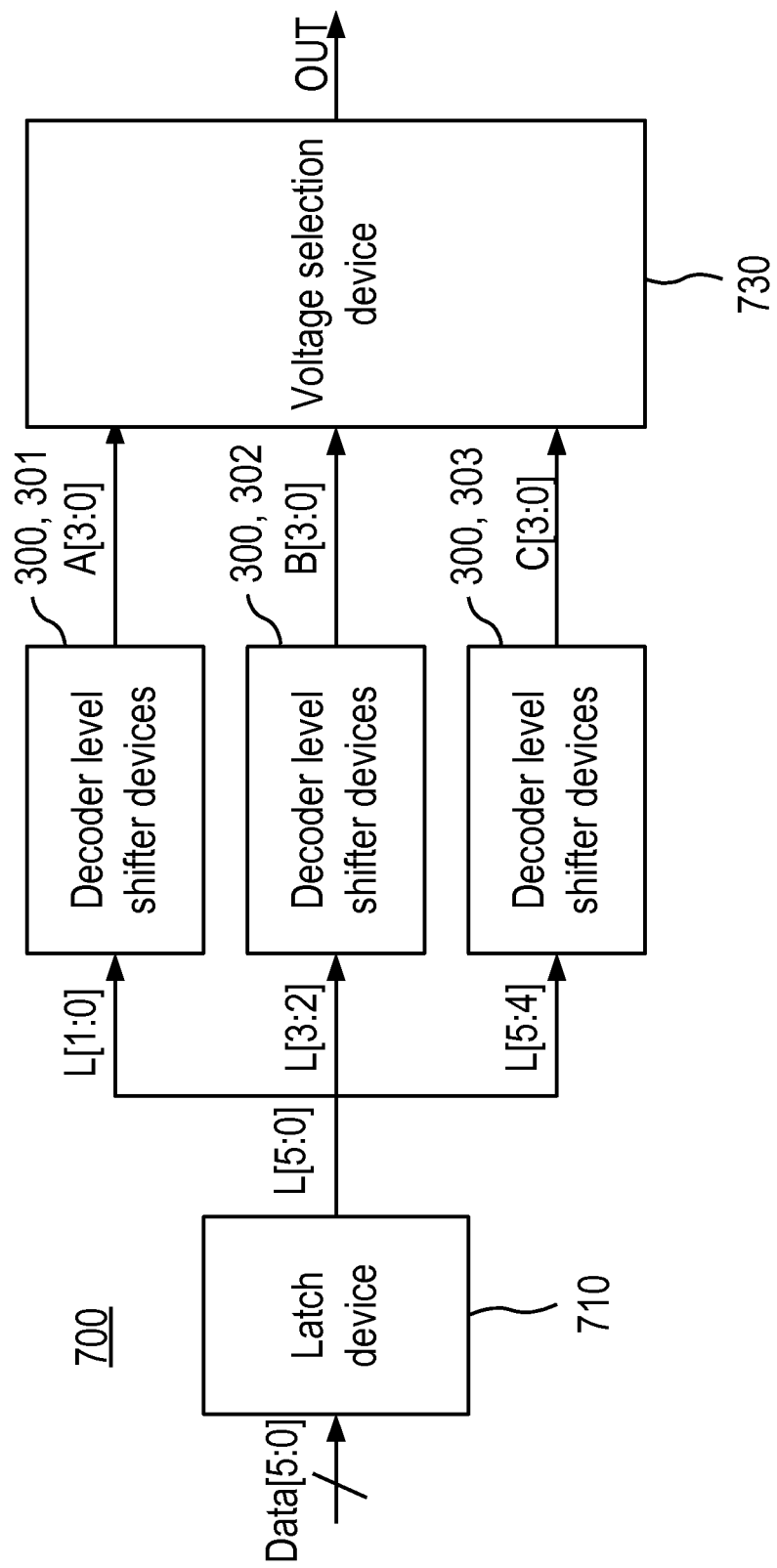
FIG. 7 is a block diagram of a digital to analog converter using a decoder level shifter device according to the invention.

FIG. 7 is a block diagram of a digital to analog converter 700 using the decoder level shifter device 300 according to the invention. The digital to analog converter 700 converts a 2×n-bit input data Data[5:0] into an analog output signal OUT, where n is a positive integer. The digital to analog converter 700 includes a latch device 710, n decoder level shifter devices 300, and a voltage selection device 730. In this embodiment, a 6-bit digital to analog converter 700, i.e., n=3, is described as an example. However, in the present invention, a digital to analog converter with a bit number other than 6 can be obtained by those skilled in the art, and thus a detailed description therefor is deemed unnecessary.

The latch device 710 receives and latches the 6(=2×n)-bit input data Data[5:0] to thus generate a 2×n-bit latch data L[5:0].

The n decoder level shifter devices 300 are connected to the latch device 710. Each decoder level shifter device receives a 2-bit latch data L[2:0] of the 2×n-bit latch data L[5:0] to thus generate a set of first to fourth control signals. Thus, the n decoder level shifter devices 300 can generate n sets of the first to fourth control signals. As shown in FIG. 7, the first decoder level shifter device 301 receives a 2-bit latch data L[2:0] of the 2×n-bit latch data L[5:0] to thus generate a first set of the first to fourth control signals A[3:0]. The second decoder level shifter device 302 receives another 2-bit latch data L[4:3] of the 2×n-bit latch data L[5:0] to thus generate a second set of the first to fourth control signals B[3:0]. The third decoder level shifter device 303 receives another 2-bit latch data L[5:4] of the 2×n-bit latch data L[5:0] to thus generate a third set of the first to fourth control signals C[3:0].

Figure 8A:
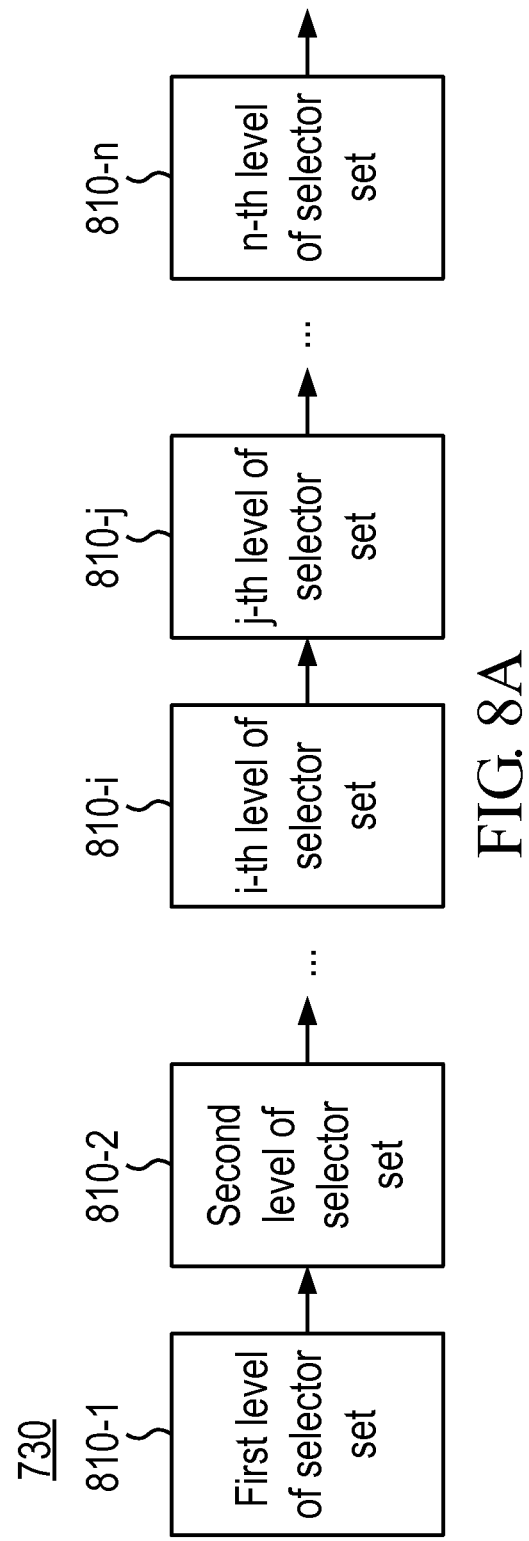
FIG. 8A is a schematic diagram of a voltage selection device according to the invention.
Figure 8B:
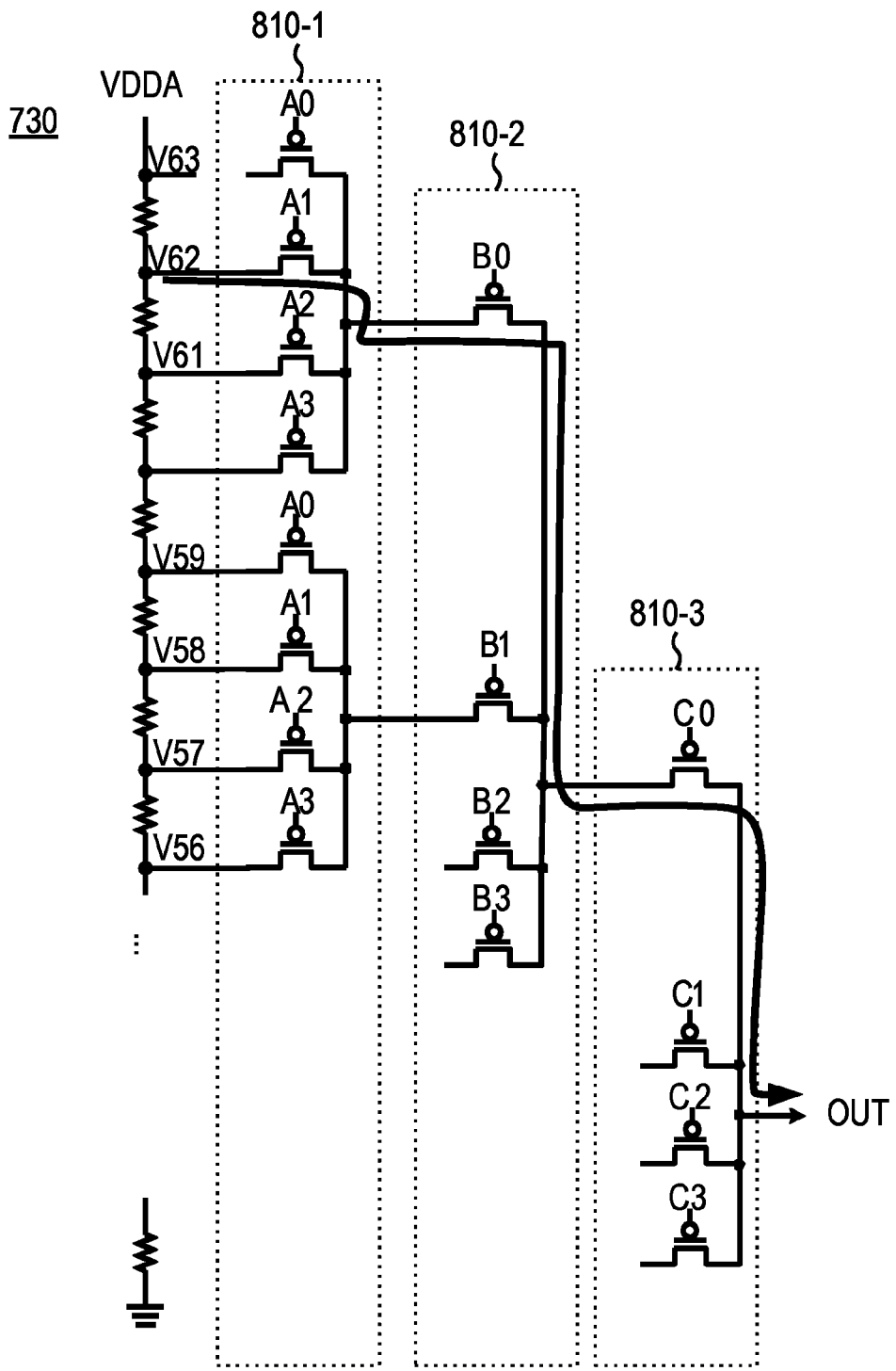
FIG. 8B is a circuit diagram of a voltage selection device according to the invention.

FIG. 8A is a schematic diagram of the voltage selection device 730 according to the invention. FIG. 8B is a circuit diagram of the voltage selection device 730 according to the invention. The voltage selection device 730 has n levels of selector set 810-1 to 810-n. The first level of selector set 810-1 has $2^n$ selectors, and accordingly an i-th level of selector set 810-has $2^{n-2(i-1)}$ selectors, where i is an index which is a positive integer. A j-th set of the first to fourth control signals controls the selectors of a j-th level of selector set 810-j in the n levels, where j is an index which a positive integer. Namely, the first set of the first to fourth control signals A[3:0] controls $64(=2^6)$ selectors of the first level of selector set 810-1, the second set of the first to fourth control signals B[3:0] controls $16(=2^4)$ selectors of the second level of selector set 810-2, and the third set of the first to fourth control signals C[3:0] controls $4(=2^2)$ selectors of the third level of selector set 810-3.

In practical use, the first output terminal OUT1B, the second output terminal OUT2B, the third output terminal OUT3B, and the fourth output terminal OUT4B of the first decoder level shifter device 301 are respectively assigned to the first to fourth control signals A[3:0] of the first set; i.e., OUT1B is assigned to A0, OUT2B is assigned to A1, OUT3B is assigned to A2, and OUT4B is assigned to A3. The other decoder level shifter devices 302, 303 are the same as cited above, except for the circuitry connection, without increasing additional circuit elements. For example, when the input data Data[5:0] is 111110b(=62), an input data to the first decoder level shifter device 301 is 10b, so the first set of the first to fourth control signals A[3:0] is 110 1b. When an input data to the second decoder level shifter device 302 is 11b, the second set of the first to fourth control signals B[3:0] is 1110b. When an input data to the third decoder level shifter device 303 is 11b, the third set of the first to fourth control signals C[3:0] is 1110b. Accordingly, the corresponding transistors are turned on, as shown in FIG. 8B, and the voltage V62 is outputted to the output terminal OUT.

In view of the foregoing, it is known that, when the decoder level shifter devices 300 in the invention are used, the number of transistors used in the voltage selection device 730 can be greatly reduced. The prior art requires 126 transistors when one transistor is used to form a selector, but the present invention requires only 84 transistors. When one PMOS transistor and one NMOS transistor are used to form a selector, the prior art requires 252 transistors, but the present invention requires only 168 transistors.

As cited, the present invention can greatly reduce the number of transistors in comparison with the decoder level shifter device or the digital to analog converter in the prior art, so as to reduce the wafer area required for the circuitry, thereby achieving the functions of cost-down and reduced power consumption.

Although the present invention has been explained in relation to its preferred embodiment, it is to be understood that many other possible modifications and variations can be made without departing from the spirit and scope of the invention as hereinafter claimed.

What is claimed is:

1. A decoder level shifter device, comprising:
a first decoder level shifter having first to fourth input terminals, a first output terminal, a second output terminal, a first enable terminal, a second enable terminal, a first reset terminal, and a second reset terminal, the first to fourth input terminals receiving a first signal, an inversion of first signal, a second signal, and an inversion of second signal, the first decoder level shifter including a latch, a first input block, a second input block, and first to fourth switches;
a second decoder level shifter having fifth to eighth input terminals, a third output terminal, a fourth output terminal, a third enable terminal, and a fourth enable terminal, the fifth to eighth input terminals receiving the first signal, the inversion of first signal, the second signal, and the inversion of second signal, wherein the first enable terminal is connected to the fourth output terminal, the second enable terminal is connected to the third output terminal, the third enable terminal is connected to the second output terminal, and the fourth enable terminal is connected to the first output terminal.

2. The decoder level shifter device as claimed in claim 1, wherein the first decoder level shifter and the second decoder level shifter are of same circuit structure.

3. The decoder level shifter device as claimed in claim 2, wherein, before performing a voltage level shift, the first switch and the second switch are turned off, and the third switch and the fourth switch are turned on, such that the first output terminal and the second output terminal are at a high voltage.

4. The decoder level shifter device as claimed in claim 3, wherein, when the first signal, the second signal, the inversion of first signal, and the inversion of second signal have a steady input voltage, the first switch and the second switch are turned on, and the third switch and the fourth switch are turned off, such that the first output terminal and the second output terminal are pulled from the high voltage to a ground voltage.

5. The decoder level shifter device as claimed in claim 4, wherein the latch includes a first PMOS transistor and a second PMOS transistor, the first input block includes first to fourth NMOS transistors, and the second input block includes third to sixth PMOS transistors.

6. The decoder level shifter device as claimed in claim 5, wherein the first PMOS transistor includes a source connected to a high voltage, a gate connected to the first output terminal, and a drain connected to a gate of the second PMOS transistor, and the second PMOS transistor includes a source connected to the high voltage and a drain connected to the gate of the first PMOS transistor.

7. The decoder level shifter device as claimed in claim 6, wherein the first switch includes a first terminal connected to the drain of the first PMOS transistor, a second terminal connected to a drain of the third NMOS transistor, and a control terminal connected to a reset signal, and the second switch includes a first terminal connected to the drain of the second PMOS transistor, a second terminal connected to a drain of the fourth NMOS transistor, and a control terminal connected to receive the reset signal.

8. The decoder level shifter device as claimed in claim 7, wherein the third NMOS transistor includes a gate connected to receive the second signal and a source connected to a drain of the first NMOS transistor, and the first NMOS transistor includes a gate connected to receive the first signal and a source connected to a ground voltage.

9. The decoder level shifter device as claimed in claim 8, wherein the fourth NMOS transistor includes a gate connected to receive the inversion of second signal and a source connected to the drain of the second NMOS transistor, and the second NMOS transistor includes a gate connected to receive the inversion of first signal and a source connected to the ground voltage.

10. The decoder level shifter device as claimed in claim 9, wherein the third PMOS transistor includes a source connected to the high voltage, a gate connected to the first enable terminal, and a drain connected to the drain of the first PMOS transistor, and the fourth PMOS transistor includes a source connected to the high voltage, a gate connected to the second enable terminal, and a drain connected to the drain of the first PMOS transistor.

11. The decoder level shifter device as claimed in claim 10, wherein the third switch includes a first terminal connected to the source of the first PMOS transistor, a second terminal connected to the drain of the first PMOS transistor, and a control terminal connected to receive an inversion of reset signal.

12. The decoder level shifter device as claimed in claim 11, wherein the fifth PMOS transistor includes a source connected to the high voltage, a gate connected to the first enable terminal, and a drain connected to the drain of the second PMOS transistor, and the sixth PMOS transistor includes a source connected to the high voltage, a gate connected to the second enable terminal, and a drain connected to the drain of the second PMOS transistor.

13. The decoder level shifter device as claimed in claim 12, wherein the fourth switch includes a first terminal connected to the source of the second PMOS transistor, a second terminal connected to the drain of the second PMOS transistor, and a control terminal connected to receive the inversion of reset signal.

14. A digital to analog converter for converting a 2×n bit input data into an analog output signal, where n is a positive integer, the digital to analog converter comprising:
a latch device for receiving the 2×n-bit input data to generate a 2×n-bit latch data;
n decoder level shifter devices connected to the latch device for respectively receiving a 2-bit latch data of the 2×n-bit latch data so as to generate a set of first to fourth control signals; and
a voltage selection device having n levels of selector set, wherein a j-th set of the first to fourth control signals controls selectors of a j-th level of selector set in the n levels of selector set, where j is an index which is a positive integer.

15. The digital to analog converter as claimed in claim 14, wherein an i-th level of selector set includes $2^{n-2(i-1)}$ selectors, where i is an index which is a positive integer.

16. The digital to analog converter as claimed in claim 14, wherein the n decoder level shifter devices have same circuit structure, each decoder level shifter device including a first decoder level shifter and a second decoder level shifter of same circuit structure, a k-th decoder level shifter device receiving (2k−1)th-bit and (2k−2)th-bit latch data of the 2×n-bit latch data, where 1≤k≤n.

17. The digital to analog converter as claimed in claim 16, wherein the first decoder level shifter includes first to fourth input terminals, a first output terminal, a second output terminal, a first enable terminal, a second enable terminal, a first reset terminal, and a second reset terminal, the first to fourth input terminals receiving the (2k−2)th-bit latch data, an inversion of (2k−2)th-bit latch data, the (2k−1)th-bit latch data, and an inversion of (2k−1)th-bit latch data, the first decoder level shifter including a latch, a first input block, a second input block, and first to fourth switches, and wherein the second decoder level shifter includes fifth to eighth input terminals, a third output terminal, a fourth output terminal, a third enable terminal, a fourth enable terminal, the fifth to eighth input terminals receiving the (2k−2)th-bit latch data, the inversion of (2k−2)th-bit latch data, the (2k−1)th-bit latch data, and the inversion of (2k−1)th-bit latch data, the first enable terminal being connected to the fourth output terminal, the second enable terminal being connected to the third output terminal, the third enable terminal being connected to the second output terminal, the fourth enable terminal being connected to the first output terminal.

18. The digital to analog converter as claimed in claim 17, wherein, before performing a voltage level shift, the first switch and the second switch are turned off, and the third switch and the fourth switch are turned on, such that the first output terminal and the second output terminal are at a high voltage, and when the first signal, the second signal, the first complementary signal, and the second complementary signal have a steady input voltage, the first switch and the second switch are turned on, and the third switch and the fourth switch are turned off, such that the first output terminal and the second output terminal are pulled from the high voltage to a ground voltage.

19. The digital to analog converter as claimed in claim 18, wherein the latch includes a first PMOS transistor and a second PMOS transistor, the first input block includes first to fourth NMOS transistors, and the second input block includes third to sixth PMOS transistors.

* * * * *